United States Patent
Wang et al.

(10) Patent No.: US 7,408,366 B2
(45) Date of Patent: Aug. 5, 2008

(54) PROBE TIPS AND METHOD OF MAKING SAME

(75) Inventors: Zhong L. Wang, Marietta, GA (US); William L. Hughes, Atlanta, GA (US); Brent A. Buchine, Smyrna, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 119 days.

(21) Appl. No.: 11/352,535

(22) Filed: Feb. 13, 2006

(65) Prior Publication Data

US 2007/0188182 A1    Aug. 16, 2007

(51) Int. Cl.
    *G01R 31/02* (2006.01)
(52) U.S. Cl. .................................... 324/754
(58) Field of Classification Search ........... None
    See application file for complete search history.

(56) References Cited

U.S. PATENT DOCUMENTS

| | | | |
|---|---|---|---|
| 5,317,141 A | | 5/1994 | Thomas |
| 5,357,109 A | * | 10/1994 | Kusumoto ............... 250/306 |
| 5,357,787 A | | 10/1994 | Kado et al. |
| 5,475,318 A | | 12/1995 | Marcus et al. |
| 5,974,662 A | | 11/1999 | Eldridge et al. |
| 6,268,608 B1 | * | 7/2001 | Chandler ............... 250/492.2 |
| 6,291,927 B1 | | 9/2001 | Percin et al. |
| 6,328,902 B1 | | 12/2001 | Hantschel et al. |
| 6,457,350 B1 | | 10/2002 | Mitchell |
| 6,756,025 B2 | | 6/2004 | Colbert et al. |
| 6,756,584 B2 | | 6/2004 | Hantschel et al. |
| 6,855,202 B2 | | 2/2005 | Alivisatos et al. |
| 6,864,481 B2 | | 3/2005 | Kaito et al. |
| 2001/0044207 A1 | * | 11/2001 | Marsh ..................... 438/676 |
| 2005/0211896 A1 | * | 9/2005 | Lu et al. .................. 250/307 |

FOREIGN PATENT DOCUMENTS

| | | | |
|---|---|---|---|
| EP | 0572972 A1 | * | 1/1993 |
| JP | 05079835 A | * | 3/1993 |
| JP | 05172508 A | * | 7/1993 |
| JP | 05172561 A | * | 7/1993 |

OTHER PUBLICATIONS

Ying Daia et al., "The octa-twin tetraleg ZnO nanostructures", Solid State Communications, 2003, pp. 629-633, vol. 126, Pergamon—Elsevier Science Ltd.

(Continued)

*Primary Examiner*—Jermele M Hollington
(74) *Attorney, Agent, or Firm*—Bryan W. Bockhop; Bockhop & Associates, LLC

(57) ABSTRACT

A probe includes a substrate and a tetragonal structure disposed on the substrate that has four end points. Three of the end points are disposed adjacent to the substrate. A fourth of the end points extends outwardly and substantially normal to the substrate. In a method of making a probe tip, a plurality of tetrapods are grown and at least one of the tetrapods is placed on a substrate at a selected location. The tetrapod is affixed to the substrate at the selected location.

14 Claims, 4 Drawing Sheets

OTHER PUBLICATIONS

U.S. Appl. No. 11/405,051, filed Apr. 17, 2006.
U.S. Appl. No. 11/297,097, filed Dec. 8, 2005.
U.S. Appl. No. 11/260,238, filed Oct. 28, 2005.
U.S. Appl. No. 11/476,625, filed Jun. 29, 2006.
U.S. Appl. No. 11/398,650, filed Apr. 6, 2006.
U.S. Appl. No. 11/548,005, filed Oct. 10, 2006.
U.S. Appl. No. 11/548,531, filed Oct. 11, 2006.
U.S. Appl. No. 11/552,274, filed Oct. 24, 2006.
Yu et al., "Catalytic synthesis and structural characteristics of high-quality tetrapod-like ZnO nanocrystals by a modified vapor transport process," Crystal Growth & Design, vol. 5, No. 1, 2005, abstract.

* cited by examiner

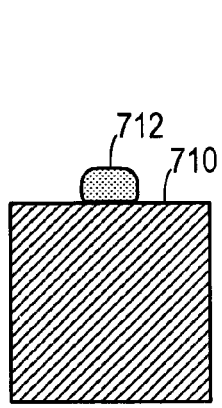 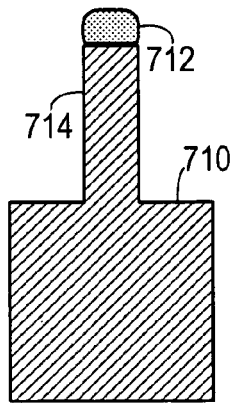 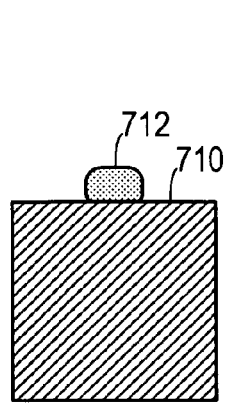 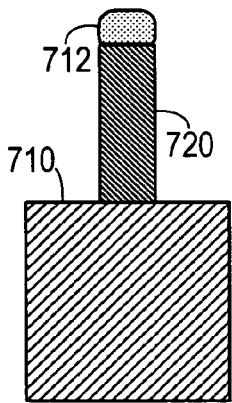
FIG. 7A   FIG. 7B   FIG. 8A   FIG. 8B
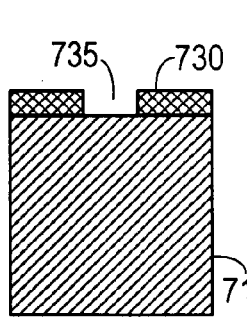 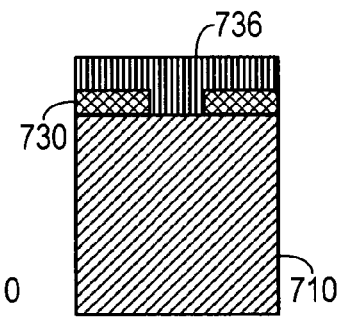 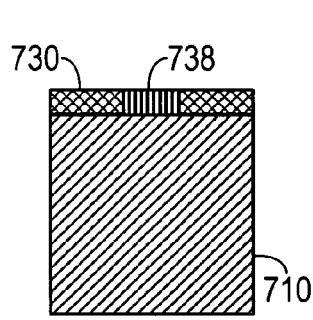
FIG. 9A   FIG. 9B   FIG. 9C
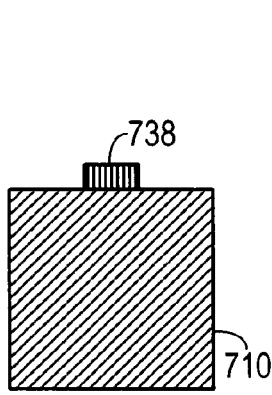 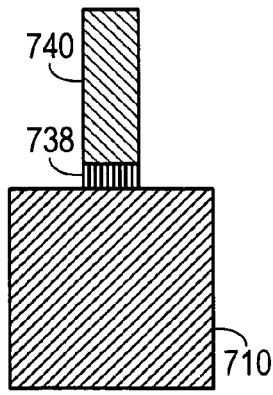
FIG. 9D   FIG. 9E

US 7,408,366 B2

PROBE TIPS AND METHOD OF MAKING SAME

STATEMENT OF GOVERNMENT INTEREST

This invention was made with support from the U.S. government under grant number ECS-0210332, awarded by National Science Foundation. The government may have certain rights in the invention.

BACKGROUND OF THE INVENTION

1. Field of the Invention

The present invention relates to probe tips and, more specifically, probe tips used in atomic force microscopy and the like.

2. Description of the Prior Art

Atomic Force Microscopes (AFM) are used to measure surface characteristics of materials at the nano scale. AFM's are useful in measuring thin and thick film coatings, ceramics, composites, glasses, synthetic and biological membranes, metals, polymers, and semiconductors, among other things. By using an AFM one can not only image the surface with near atomic resolution but can also measure the forces of the surface of a sample at the nano-Newton scale.

An AFM typically includes a probe with a probe tip extending therefrom. One type of probe is a cantilever; another is a force sensing integrated readout and active tip (FIRAT) probe. A cantilever includes a beam with a probe tip at a distal end. The beam may be angularly deflected to move the probe tip toward the object being measured. When the probe tip begins to interact with the object, the deflection of the beam can be measured by sensing light from a laser reflected off of the beam. A FIRAT probe includes a membrane that is supported by a frame. A FIRAT probe tip is typically affixed to the center of the membrane. The membrane may be displaced vertically by one of several methods. In one such method, the membrane has a first conductive surface that is spaced apart from a second conductive surface. When a similar charge is applied to both the first conductive surface and the second conductive surface, the two surfaces repel each other, thereby forcing the membrane (and the probe tip) away from the second conductive surface. The vertical displacement of the probe tip is controlled in this way. The vertical displacement of the membrane is detected by reflecting light from a laser off of the membrane and passing the reflected light through a diffraction grating and then measuring the intensity of one or more modes of the diffracted light using a photodetector.

Probe tips should be hard relative to the object being measured and should have a high aspect ratio. (Aspect ratio is the ratio of the longest dimension of a probe tip to its widest dimension. Thus, something with a high aspect ration is long and thin.) Also, once mounted, a probe tip should be substantially normal to the probe surface.

With current AFM probe designs, forming and mounting the probe tip is a relatively costly process. Typical methods of making probe tips including cleaving hard crystals to form sharp shards and then gluing the shards to a probe surface. Such methods are complicated and time consuming. Also, getting the probe tip to be normal to the probe surface can be difficult.

Therefore, there is a need for method of making a self-aligned probe tip that is always substantially normal to the probe surface.

There is also a need for a method of making probe tips that have a high aspect ratio.

There is also a need for a method of making probe tips economically.

SUMMARY OF THE INVENTION

The disadvantages of the prior art are overcome by the present invention which, in one aspect, is a probe that includes a substrate and a tetragonal structure disposed on the substrate. The tetragonal structure has four end points, with three of the end points disposed adjacent to the substrate. A fourth of the end points extends outwardly and substantially normal to the substrate.

In another aspect, the invention is a method of making a probe tip in which a plurality of tetrapods are grown. At least one of the tetrapods is placed on a substrate at a selected location. The tetrapod is affixed to the substrate at the selected location.

In yet another aspect, the invention is a method of making a probe that includes a substrate. A nano-wire is grown from a selected surface of a substrate, thereby forming a probe tip. The substrate is affixed to a probe structure, thereby making the probe.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIG. 7A-7B are side view schematic diagrams demonstrating a second method for growing a nano-wire probe tip.

FIG. 8A-8B are side view schematic diagrams demonstrating a third method for growing a nano-wire probe tip.

FIG. 9A-9E are side view schematic diagrams demonstrating a fourth method for growing a nano-wire probe tip.

DETAILED DESCRIPTION OF THE INVENTION

Figure 1A:
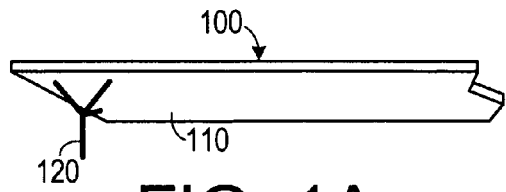
FIG. 1A is a perspective view of a tetrapod probe tip affixed to a cantilever beam.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 1C:
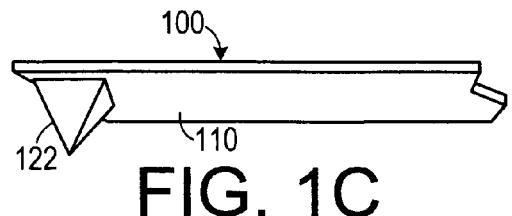
FIG. 1C is a perspective view of a tetrapod probe tip affixed to a membrane-type probe.
Figure 1B:
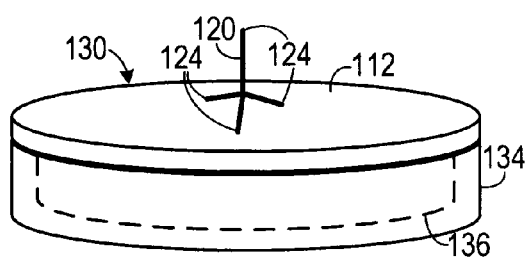
FIG. 1B is a perspective view of a tetrahedral probe tip affixed to a cantilever beam.
Figure 1D:
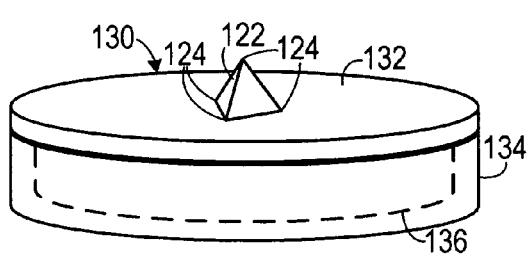
FIG. 1D is a perspective view of a tetrahedral probe tip affixed to a membrane-type probe.

As shown in FIGS. 1A-1D, one illustrative embodiment of the invention includes a probe that has a substrate and a tetragonal structure on the substrate. The probes shown in FIGS. 1A and 1C are cantilever-type probes 100 that have beam-type substrates 110. The probes shown in FIGS. 1B and 1D are membrane-type probes 130, such as FIRAT (Force sensing Integrated Readout and Active Tip) probes. A membrane-type probe 130 includes a housing 134 that defines a cavity 136 therein. A membrane substrate 112 is supported by the housing 134. Displacement of the substrate 112 is measured optically by reflecting a light beam off of the substrate 112. FIRAT probes are disclosed in U.S. patent application Ser. No. 11/260,238, filed on Oct. 28, 2005, the entirety of which is incorporated herein by reference.

The tetragonal structures shown in FIGS. 1A and 1B are tetrapods 120. A tetrapod is a three-dimensional geometric shape that contains four extremities (feet, legs, or leg-like appendages) that which extend from a central location. The tetragonal structures shown in FIGS. 1C and 1D are tetrahedrons 122. A tetrahedron (triangular pyramid) is a polyhedron that has four faces, four vertices, and six edges. The tetragonal structures used in this embodiment have four end points 124, three of which are disposed adjacent to the substrate 110 or 112 and the fourth end point extends outwardly and is substantially normal to the substrate.

Figure 2:
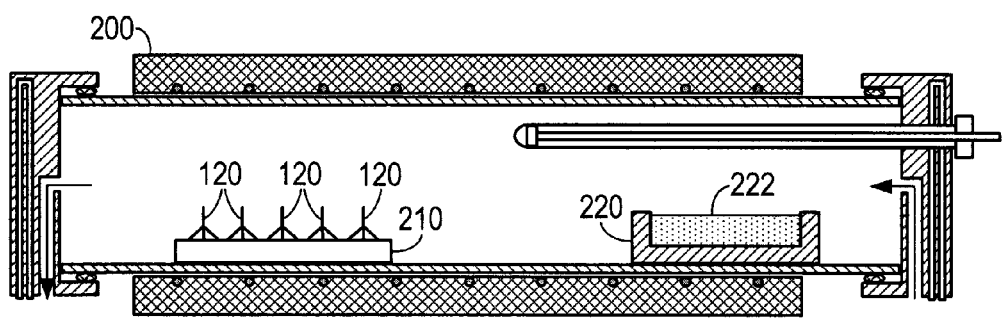
FIG. 2 is a cross-sectional view of a tube furnace used in making tetrapod probe tips.
Figure 3A:
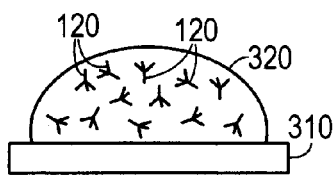
FIGS. 3A-3E are side view schematic diagrams showing one method of securing a tetrapod to a probe surface.
Figure 3B:
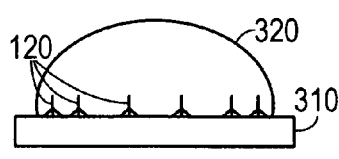
Figure 3C:
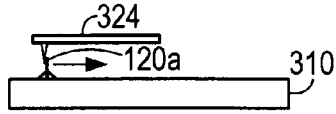
Figure 3D:
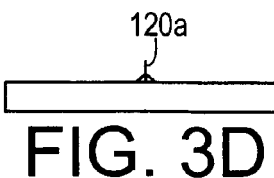
Figure 3E:
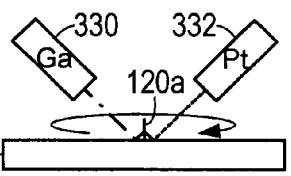

In one embodiment, shown in FIG. 2, tetrapods 120 are grown in a reaction chamber, such as a tube furnace 200. To grow tetrapods 120, a precursor 222 is placed in a crucible 220 in the tube furnace 200 and a substrate 210, such as an aluminum substrate, is placed downstream from the precursor 222. The precursor 222, and the resulting tetrapod, could be made of a metal oxide, such as zinc oxide. It could also be made from other crystalline substances, such as cadmium telluride. It is understood that any tetrapod of appropriate size falls within the scope of the present invention.

The tube furnace 200 is heated to a preselected temperature for a preselected period of time. The precursor 222 evaporates and is subsequently deposited on the substrate 210. The crystal form of the structure that grows on the substrate may be controlled by controlling the temperature and pressure inside the tube furnace 200.

In one experimental example of growing tetrapods, ZnO tetrapod nanostructures were synthesized by thermal evaporation of 99.9% pure zinc powders under controlled conditions without the presence of catalyst. Zinc powder was placed in an alumina crucible that was inserted in a horizontal tube furnace, where the temperature, pressure, and evaporation time were controlled. The temperature of the furnace was ramped to 850-950° C. at a rate of 50° C./min. and kept at that temperature for 1-30 minutes. T-ZnO nanostructures were obtained in the reaction vessel. It should be understood that these parameters are given as one example only and that many other permutations are possible that will generate suitable structures. It is intended that all such permutations will fall within the scope of the claims below.

As shown in FIGS. 3A-3E, the tetrapods 120 can be suspended in a liquid 320, such as water, alcohol, acetone, or any other substantially non-reactive liquid that is capable of suspending the tetrapods 120. The liquid 320 is placed on a substrate 310 and the tetrapods 120 are allowed to settle onto the substrate 320. The liquid 320 is allowed to evaporate from the substrate 310 and the tetrapods 120 naturally settle with three of the endpoints resting on the substrate 310. A selected one of the tetrapods 120a can be moved to a selected location (such as the center) of the substrate 310 using an atomic force microscope (or by using one of several other types of known microscopy and manipulation techniques). The selected tetrapod 120a is then attached to the substrate 310 by applying a precursor 332, such as platinum, and a focused ion beam 330, such as a gallium ion beam, or an electron beam, to an area adjacent the endpoints of the selected tetrapod 120a, thereby forming a focused beam assisted bond. While this is occurring, the substrate 310 is rotated, thereby bonding each of the endpoints to the substrate 310. This method of bonding has the advantage of operating at a relatively low temperature, thereby not harming other components of the probe. In one embodiment, the substrate 310 is a membrane of an already existing probe, in another embodiment, the substrate 310 is attached to the probe after the tetrapod 120a is attached to the substrate 310. While the bond shown is platinum, it could include one of several materials, such as: metals, semiconductors, oxides, and polymers. Materials used could include: platinum, tungsten, quartz, and carbon.

Figures 4A, 4B, 4C, 4D:
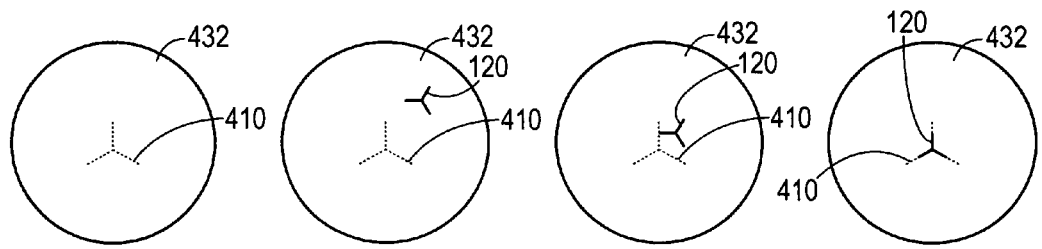
FIGS. 4A-4D are top view schematic diagrams showing one method of moving a tetrapod to a preselected location and a preselected orientation.

One manner of facilitating placement of the tetrapod 120 in the center, or other desired location, of a substrate 432 is shown in FIGS. 4A-4D. Initially, a pattern 410 corresponding to a vertical projection of the tetrapod is placed on the substrate at the preselected location. The pattern 410 comprises a substance that is attractive to the tetrapod, such as an amphiphile (e.g., thiol) and may be printed onto the substrate using well known micro-scale marking techniques. As the tetrapod 120 is brought near the projection 410, it is attracted to the projection 410 and eventually settles on the projection 410, as shown in FIG. 4D, with the desired orientation.

Figure 5A:
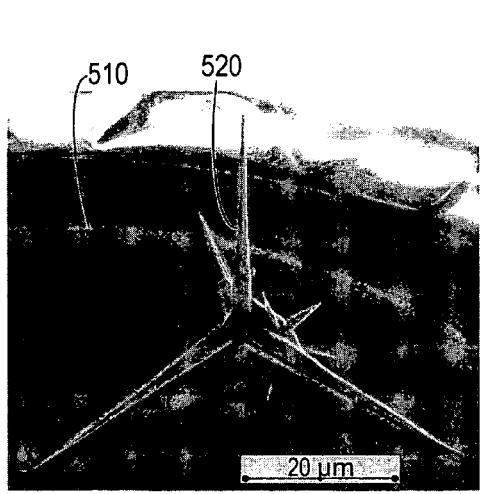
FIG. 5A-5B are micrographs of tetrapods.
Figure 5B:
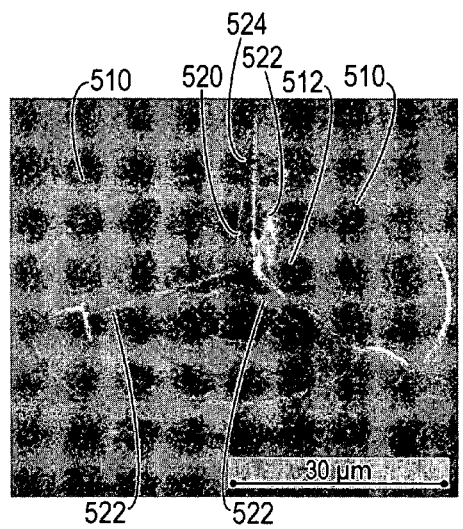

A micrograph of a tetrapod 520 resting on a substrate 510 is shown in FIG. 5A. A micrograph of a tetrapod 520 affixed to a substrate 510 is shown in FIG. 5B. This micrograph shows three base legs 522 of the tetrapod 520 with an outer layer of platinum 510 and an inner layer of platinum 512 acting as a bond and holding the legs 522 to the substrate 510. In this manner a probe leg 524 extends outwardly from, and substantially normal to the substrate 510.

A common characteristic of tetragonal structures is that when they are placed onto any smooth (flat or curved) solid surface, three of the four extremities will contact the substrate surface while the fourth will be free and orthogonal to the surface. This provides the advantage of creating a self-aligned probe tip.

Figure 6A:
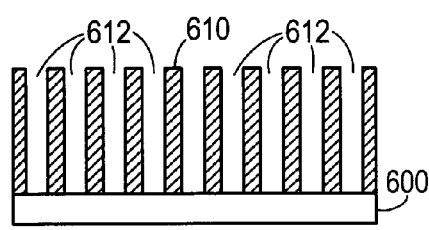
FIG. 6A-6E are side view schematic diagrams demonstrating a first method for growing a nano-wire probe tip.
Figure 6B:
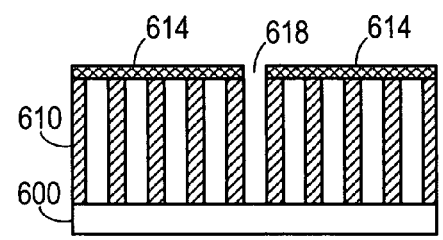
Figure 6C:
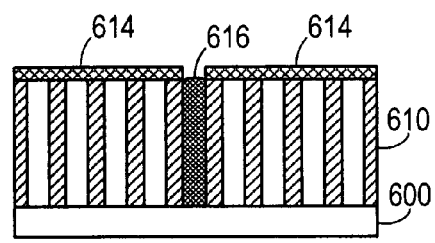
Figure 6D:
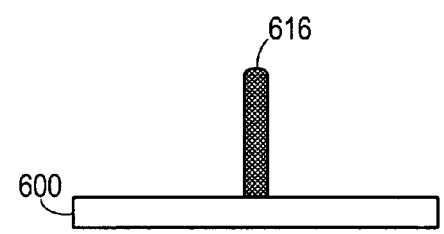
Figure 6E:
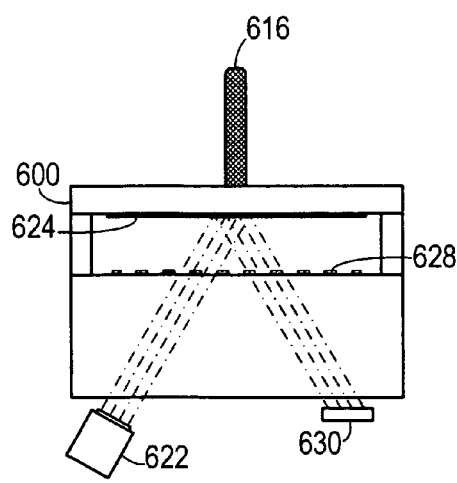

In an alternate embodiment of the invention, a nano-wire probe tip may be grown onto a substrate. In one illustrative embodiment of a method for growing a nano-wire at a selected position, shown in FIGS. 6A-6D, a porous anodized aluminum oxide membrane 610 is formed on a substrate 600, so that the channels 612 extend vertically from the substrate 600. All of the channels 612 except for preselected channels 618 are covered with a mask material 614, as shown in FIG. 6B. A nano-wire 616 is grown from the substrate 600 in the exposed channel 616 using a process such as electro-deposition, as shown in FIG. 6C. The anodized aluminum oxide membrane 610 and the mask material 614 are removed by etching, leaving the nano-wire 616, as shown in FIG. 6D. The substrate 600 can be part of a probe surface, such as the membrane-type probe shown in FIG. 6E. Such a probe typically includes a reflective surface 624 on the substrate membrane 600 disposed oppositely from the probe tip 616. A light source 622 such as a semiconductor laser, directs a beam of light at the reflective surface 624, which reflects the beam through a diffraction grating 628 to a photodetector 630. The intensity of the detected light indicates the position, and thus displacement, of the membrane 600.

Porous anodic aluminum oxide (AAO) membranes can have channel diameters as small as a few nanometers with short channel-to-channel distances that can be controlled easily by varying the anodizing conditions. Highly ordered, straight nanopores, or channels, in hexagonally close-packed arrays can be fabricated with very high aspect ratios. AAO membranes can be made directly on aluminum substrates. They may also be fabricated on substrates other than aluminum by first removing the aluminum backing and attaching them to other materials during an additional processing step.

In another method of growing a probe tip, as shown in FIGS. 7A and 7B, a catalyst particle 712 is placed on a substrate 710. A deposition process is used to grow a nano-wire 714. One of several processes my be used; examples of such processes include: thermal evaporation, metal-organic chemical vapor deposition, pulsed laser deposition, chemical vapor transport and aqueous solution method. The nano-wire 714 shown in FIGS. 7A and 7B is grown by homoepitaxy, in which nano-wire 714 is in crystal continuity with the substrate 710. In this case a single crystal is grown through solution phase or gas phase synthesis. As shown in FIGS. 8A and 8B, heteroepitaxy may also be employed, wherein the nano-wire 720 is crystallographically distinct from the substrate 710. As shown in FIGS. 9A-9E, seeded epitaxy may be employed to grow the nano-wire 740. In this type of process, a mask 730 is placed on the substrate 710 so that an opening 735, defined through the mask, exposes a selected portion of the substrate 710. A seed material, which could include the same material as the material from which the nano-wire 740 is to be grown or a catalyst, is applied to the mask layer 730 and the opening 735. The mask material is removed, e.g. by etching, leaving a seed material nucleus 738. A nano-wire 740 is then grown from the nucleus 738 using generally known nano-scale chemical deposition methods. Discussions of nano-wire and nano-rod growth may be found in U.S. Pat. Nos. 6,863,943 and 6,940,086, and U.S. patent application Ser. No. 11/010,178, filed Dec. 10, 2004, all of which are incorporated herein by reference.

Gas-phase and solution-phase syntheses are two methodologies that which produce vertically-aligned structures. Current examples of gas-phase syntheses techniques are; thermal evaporation1, metal-organic chemical vapor deposition (MOCVD), pulsed laser deposition (PLD), and chemical vapor transport (CVT) while the primary example for solution-phase synthesis is the aqueous solution method (ASM). A key requirement for the vertical alignment of such structures, regardless of the methodology and subsequent technique used, is the nucleation-and-growth of the structures onto an epitaxial layer.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A probe, comprising:
   a. a substrate;
   b. a tetragonal structure disposed on the substrate, the tetragonal structure having four end points, three of the end points being disposed adjacent to the substrate, a fourth of the end points extending outwardly and substantially normal to the substrate; and
   c. a ring-shaped ion beam-generated bond that bonds the three end points to the substrate wherein the bond comprises a material selected from a group consisting of: platinum, tungsten, quartz, and carbon.

2. The probe of claim 1, wherein the tetragonal structure comprises a tetrapod.

3. The probe of claim 2, wherein the tetrapod comprises a metal oxide.

4. The probe of claim 3, wherein the metal oxide comprises zinc oxide.

5. The probe of claim 2, wherein the tetrapod comprises cadmium telluride.

6. The probe of claim 1, wherein the tetragonal structure comprises a tetrahedron.

7. The probe of claim 1, wherein the substrate comprises a material selected from a group consisting of: a metal; a semiconductor, oxide, and a polymer.

8. The probe of claim 1, wherein the substrate comprises a portion of a cantilever.

9. The probe of claim 1, wherein the substrate comprises a portion of a membrane.

10. A probe sensor, comprising:
    a. a disk-shaped membrane supported by a housing that defines a cavity that is covered by the membrane, the membrane having a center; and
    b. a tetragonal structure disposed on the membrane adjacent to the center, the tetragonal structure having four end points, three of the end points being disposed adjacent to the membrane, a fourth of the end points extending outwardly and substantially normal to the membrane; and
    c. a ring-shaped bond, disposed around the center of the membrane, that affixes the three end points to the membrane, wherein the ring-shaped bond comprises an ion beam-generated bond and wherein the bond comprises a material selected from a group consisting of: platinum, tungsten, quartz, and carbon.

11. The probe of claim 10, wherein the substrate comprises a material selected from a group consisting of: a metal, a semiconductor, an oxide, and a polymer.

12. The probe of claim 10, wherein the tetragonal structure comprises a tetrapod.

13. The probe of claim 12, wherein the tetrapod comprises selected from a group consisting of: zinc oxide and cadmium telluride.

14. The probe of claim 10, wherein the membrane comprises a material selected from a group consisting of: a metal; a semiconductor, oxide, and a polymer.

* * * * *